(12) United States Patent
Sasamoto et al.

(10) Patent No.: US 11,774,845 B2
(45) Date of Patent: Oct. 3, 2023

(54) PHOTOMASK BLANK, AND MANUFACTURING METHOD THEREOF

(71) Applicant: Shin-Etsu Chemical Co., Ltd., Tokyo (JP)

(72) Inventors: Kouhei Sasamoto, Joetsu (JP); Hideo Kaneko, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 21 days.

(21) Appl. No.: 17/354,180

(22) Filed: Jun. 22, 2021

(65) Prior Publication Data

US 2021/0405520 A1    Dec. 30, 2021

(30) Foreign Application Priority Data

Jun. 30, 2020  (JP) ................... 2020-112663

(51) Int. Cl.
   *G03F 1/26*  (2012.01)
(52) U.S. Cl.
   CPC ..................... *G03F 1/26* (2013.01)
(58) Field of Classification Search
   None
   See application file for complete search history.

(56) References Cited

U.S. PATENT DOCUMENTS

| | | | | |
|---|---|---|---|---|
| 4,080,267 A | * | 3/1978 | Castellani | C23F 1/02 205/70 |
| 5,089,361 A | * | 2/1992 | Huang | G03F 1/50 430/323 |
| 5,362,591 A | * | 11/1994 | Imai | G03F 1/26 430/323 |
| 5,725,971 A | * | 3/1998 | Moriuchi | G03F 1/36 430/311 |
| 2002/0136966 A1 | * | 9/2002 | Shinagawa | G03F 1/46 204/192.1 |

(Continued)

FOREIGN PATENT DOCUMENTS

| | | | | |
|---|---|---|---|---|
| CN | 109960105 A | * | 7/2019 | ............ G03F 1/26 |
| CS | 273791 | * | 12/1988 | |

(Continued)

OTHER PUBLICATIONS

Machine translation of JP 2004-045461 (2004).*

(Continued)

*Primary Examiner* — Martin J Angebranndt
(74) *Attorney, Agent, or Firm* — Birch, Stewart, Kolasch & Birch, LLP (57) ABSTRACT

In a photomask blank including a transparent substrate and a first inorganic film containing either or both of a transition metal and silicon, and optional a second inorganic film containing either or both of a transition metal and silicon, when an intensity of secondary ions is measured in the thickness direction of the transparent substrate and the inorganic films by TOF-SIMS with using a primary ion source of Bi and a sputtering ion source of Cs, an intensity of secondary ions containing carbon detected at the interface of the transparent substrate and the inorganic film or the inorganic films is higher than both intensities of the secondary ions containing carbon detected, respectively, at the sides remote from the interface.

6 Claims, 1 Drawing Sheet

(56) References Cited

U.S. PATENT DOCUMENTS

| | | | |
|---|---|---|---|
| 2005/0142463 A1 | 6/2005 | Mitsui et al. | |
| 2005/0250018 A1* | 11/2005 | Ushida | G03F 1/58 |
| | | | 428/428 |
| 2007/0212618 A1 | 9/2007 | Yoshikawa et al. | |
| 2007/0248897 A1* | 10/2007 | Yoshikawa | G03F 1/32 |
| | | | 428/428 |
| 2013/0177841 A1* | 7/2013 | Sakai | G03F 1/38 |
| | | | 430/5 |
| 2013/0273738 A1* | 10/2013 | Sakai | G03F 1/50 |
| | | | 438/689 |
| 2015/0355537 A1* | 12/2015 | Yamada | G03F 1/32 |
| | | | 430/5 |

FOREIGN PATENT DOCUMENTS

| | | | |
|---|---|---|---|
| EP | 3 339 953 A1 | | 6/2018 |
| JP | 2002-244274 A | | 8/2002 |
| JP | 2004-45481 A | | 2/2004 |
| JP | 2004291209 A | * 10/2004 | ........... B24B 37/042 |
| JP | 2006310706 A | * 11/2006 | |
| JP | 2007-241065 A | | 9/2007 |
| JP | 2012137676 A | * 7/2012 | |
| JP | 2012212081 A | * 11/2012 | |
| KR | 20070098702 | * 10/2007 | |
| RU | 2308179 C1 | * 10/2007 | |
| RU | 2319189 C2 | * 3/2008 | |

OTHER PUBLICATIONS

Meyers, "Sources of TOC in deionized water", IWC-98-37 8 pages (PSM (1998).*

Extended European Search Report for European Application No. 21180711.0, dated Dec. 7, 2021.

Office Action issued in Japanese Patent Application No. 2020-112663, dated Feb. 21, 2023.

* cited by examiner

FIG.1A  FIG.1B  FIG.1C

PHOTOMASK BLANK, AND MANUFACTURING METHOD THEREOF

CROSS-REFERENCE TO RELATED APPLICATION

This non-provisional application claims priority under 35 U.S.C. § 119(a) on Patent Application No. 2020-112663 filed in Japan on Jun. 30, 2020, the entire contents of which are hereby incorporated by reference.

TECHNICAL FIELD

This invention relates to a photomask blank which is a material for a photomask used in manufacturing semiconductor integrated circuits, and the likes, and a method for manufacturing the same.

BACKGROUND ART

In the recent semiconductor processing technology, a challenge to higher integration of large-scale integrated circuits places an increasing demand for miniaturization of circuit patterns. There are increasing demands for further reduction in size of circuit-constructing wiring patterns and for miniaturization of contact hole patterns for cell-constructing inter-layer connections. As a consequence, in the manufacture of circuit pattern-written photomasks for use in the photolithography of forming such wiring patterns and contact hole patterns, a technique capable of accurately writing finer circuit patterns is needed to meet the miniaturization demand.

In order to form a higher accuracy photomask pattern on a photomask substrate, it is of first priority to form a high accuracy resist pattern on a photomask blank. In the currently prevailing lithography, a circuit pattern to be written has a size far smaller than the wavelength of light used. If a photomask pattern which is a mere 4-time magnification of the circuit feature is used, a shape corresponding to the photomask pattern is not transferred to the resist film due to influences such as optical interference occurring in the actual photolithography operation. To mitigate these influences, in some cases, the photomask pattern must be designed to a shape which is more complex than the actual circuit pattern, i.e., a shape to which the so-called optical proximity correction (OPC) is applied. Then, at the present, the lithography technology for obtaining photomask patterns also requires a higher accuracy processing method.

As a light-shielding film for the photomask, for example, Cr-based films are used for the light-shielding film. Examples of Cr-based light-shielding films include a film consisting of a light-shielding layer and an antireflection layer, and having a two-layered structure in which the light-shielding layer and antireflection layer are disposed from the side of a substrate, or a three-layered structure in which the light-shielding layer, antireflection layer and light-shielding layer are disposed from the side of a substrate. Further, in the Cr-based film, at least one element selected from the group consisting of oxygen, nitrogen and carbon is generally added in order to improve etching rate or pattern shape.

Further, as a light-shielding film or a phase shift film for the photomask, Si-based films are also used in some cases. For a photomask using the Si-based film, for example, a structure in which an etching stopper film of a Cr-based film is provided at the side of a substrate of the Si-based film, and a structure in which a hard mask film of a Cr-based film is provided at the side remote from a substrate of the Si-based film are exemplified (Patent Document 1: JP-A 2007-241065).

CITATION LIST

Patent Document 1: JP-A 2007-241065

SUMMARY OF THE INVENTION

In the process of forming a photomask pattern, a photoresist film is formed on a photomask blank including a light-shielding film or a phase shift film on a transparent substrate, a pattern is drawn by an electron beam, and a resist pattern is developed. Then, the light-shielding film or the phase-shift film is etched to form a light-shielding film pattern or a phase-shift film pattern by using the obtained resist pattern as an etching mask. In the process of manufacturing a photomask, particularly in the process of manufacturing a photomask using a photoresist film, heat treatment is usually required. This heat treatment is performed after applying the resist or drawing the pattern. However, the heat treatment has a problem that optical properties such as transmittance, reflectance, phase shift amount, and the like of the light-shielding film and the phase-shift film that composed of a Cr-based film or a Si-based film change.

The present invention has been made to solve the above problems, and an object of the present invention is to provide a photomask blank having optical properties such as transmittance, reflectance, phase shift amount, and the like that do not easily change, even when heat treatment is performed in the process of manufacturing a photomask from a photomask blank. Another object of the present invention is to provide a manufacturing method of the photomask blank.

With respect to a photomask blank that includes a structure in which a transparent substrate is contact with a first inorganic film which contains either or both of a transition metal and silicon, or a structure in which a first inorganic film which contains either or both of a transition metal and silicon is contact with a second inorganic film which contains either or both of a transition metal and silicon, the inventors measured an intensity of secondary ions in the thickness direction of the transparent substrate and the inorganic films by a time-of-flight secondary ion mass spectrometry (TOF-SIMS) with using a primary ion source of Bi and a sputtering ion source of Cs. As a result, the inventors found a photomask blank having an intensity of secondary ions containing carbon detected at the interface of the transparent substrate and the first inorganic film or the first inorganic film and the second inorganic film that is higher than both intensities of the secondary ions containing carbon detected, respectively, at the side remote from the interface. Further, the inventors found that such a photomask blank has high thermal resistance in changes of the optical properties of a inorganic film in the photomask blank.

In first aspect, the invention provides a photomask blank including a transparent substrate, a first inorganic film which is in contact with the transparent substrate and contains either or both of a transition metal and silicon, wherein when an intensity of secondary ions is measured in the thickness direction of the transparent substrate and the first inorganic film by a time-of-flight secondary ion mass spectrometry (TOF-SIMS) with using a primary ion source of Bi and a sputtering ion source of Cs, an intensity of secondary ions containing carbon detected at the interface of the transparent substrate and the first inorganic film is higher than both intensities of the secondary ions containing carbon detected, respectively, at the side of the substrate and the side of the first inorganic film.

Preferably, the transparent substrate is a quartz substrate, and the first inorganic film is formed by using only raw materials being substantively free of carbon.

Preferably, the secondary ions containing carbon are secondary ions of C.

Preferably, the first inorganic film contains nitrogen, and the secondary ions containing carbon are secondary ions of CN.

In second aspect, the invention provides a photomask blank including a transparent substrate, a first inorganic film which contains either or both of a transition metal and silicon, and a second inorganic film which contains either or both of a transition metal and silicon, has a composition different from a composition of the first inorganic film, and is in contact with the first inorganic film, wherein when an intensity of secondary ions is measured in the thickness direction of the first inorganic film and second inorganic film by a time-of-flight secondary ion mass spectrometry (TOF-SIMS) with using a primary ion source of Bi and a sputtering ion source of Cs, an intensity of secondary ions containing carbon detected at the interface of the first inorganic film and the second inorganic film is higher than both intensities of the secondary ions containing carbon detected, respectively, at the side of the first inorganic film and the side of the second inorganic film.

Preferably, each of the first inorganic film and the second inorganic film is formed by using only raw materials being substantively free of carbon.

Preferably, the secondary ions containing carbon are secondary ions of C.

Preferably, each of both of the first inorganic film and the second inorganic film contain nitrogen, and the secondary ions containing carbon are secondary ions of CN.

Preferably, one of the first inorganic film and the second inorganic film contains chromium and is free of silicon, and the other contains silicon and is free of chromium.

In third aspect, the invention provides a method for manufacturing the photomask blank, including the step of treating the film forming surface of the transparent substrate for the first inorganic film by contacting the surface with an aqueous solution including an organic substance, before the first inorganic film is formed.

In fourth aspect, the invention provides a method for manufacturing a photomask blank, including the step of treating the film forming surface of the first inorganic film for the second inorganic film by contacting the surface with an aqueous solution including an organic substance, before the second inorganic film is formed.

Preferably, in the methods, the aqueous solution containing an organic substance is pure water having a total organic carbon (TOC) of not less than 3 ppb and not more than 100 ppb.

Advantageous Effects of the Invention

According to the invention, a photomask blank having optical properties such as transmittance, reflectance, phase shift amount, and the like that do not easily change by heat treatment performed in the process of manufacturing a photomask from a photomask blank can be provided.

DESCRIPTION OF THE PREFERRED EMBODIMENT

A photomask blank of a first embodiment of the invention includes a transparent substrate (a substrate transparent to exposure light), preferably a quartz substrate, and a first inorganic film containing either or both of a transition metal and silicon. The transparent substrate and the first inorganic film are in contact with each other.

A photomask blank of a second embodiment of the invention includes a transparent substrate (a substrate transparent to exposure light), preferably a quartz substrate, a first inorganic film containing either or both of a transition metal and silicon, and a second inorganic film containing either or both of a transition metal and silicon. The first inorganic film and the second inorganic film are in contact with each other. The first inorganic film and the second inorganic film may be formed directly on the transparent substrate, i.e., either of the first inorganic film and the second inorganic film may be in contact with the transparent substrate. The first inorganic film and the second inorganic film may be formed via one or more other inorganic films (for example, a third inorganic film, or the like). In this embodiment, the first inorganic film and the second inorganic film preferably have different compositions each other. In particular, some or all of the constituent elements may be different, or the constituent elements are the same but their concentrations are different.

Figure 1A:
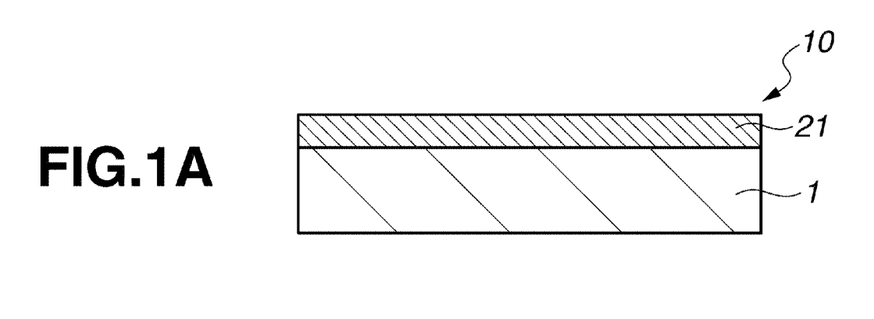
FIG. 1A is a cross-sectional view showing an example of the first embodiment of a photomask blank of the invention.
Figure 1B:
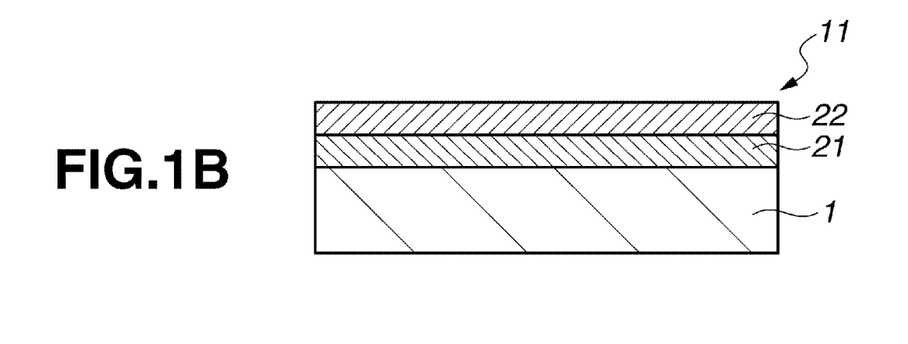
FIG. 1B is a cross-sectional view showing another example of the first embodiment of a photomask blank of the invention or an example of the second embodiment of a photomask blank of the invention.
Figure 1C:
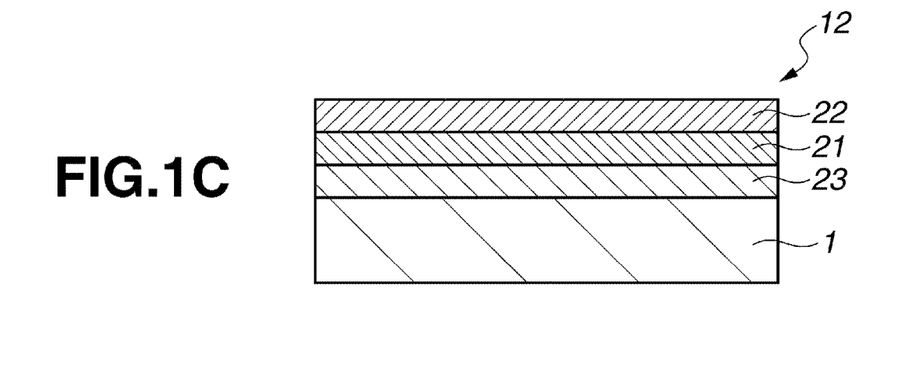
FIG. 1C is a cross-sectional view showing another example of the second embodiment of a photomask blank of the invention.

FIG. 1A is a cross-sectional view showing an example of the first embodiment of a photomask blank of the invention. In the photomask blank 10, the first inorganic film 21 is formed in contact with the transparent substrate 1. FIG. 1B is a cross-sectional view showing another example of the first embodiment of a photomask blank of the invention or an example of the second embodiment of a photomask blank of the invention. In the photomask blank 11, the first inorganic film 21 is formed in contact with the transparent substrate 1, and the second inorganic film 22 is formed in contact with the first inorganic film 21, and two inorganic films are included and formed on the transparent substrate 1 in this order. FIG. 1C is a cross-sectional view showing another example of the second embodiment of a photomask blank of the invention. In the photomask blank 12, the first inorganic film 21 is formed via the third inorganic film 23 on the transparent substrate 1, and the second inorganic film 22 is formed in contact with the first inorganic film 21, and three inorganic films are included and formed on the transparent substrate 1 in this order.

Each of the first inorganic film and the second inorganic film may consist of single layer or a plurality of layers (two or more, usually four or less). Further, one or more other inorganic films (for example, a fourth inorganic film, or the like) and/or an organic film such as a resist film may be formed on the side remote from the transparent substrate of the second inorganic film.

In the above-mentioned cases as examples, one first inorganic film and one second inorganic film are laminated and the first inorganic film is disposed at the substrate side. However, with respect to the order of the first inorganic film and the second inorganic film, either the first inorganic film or the second inorganic film may be disposed at the substrate side. Further, the photomask blank of the invention is not limited to a photomask blank in which one first inorganic film and one second inorganic film are laminated, i.e., a photomask blank having one interface where the first inorganic film and the second inorganic film are in contact with each other. Examples of the photomask blank of the invention includes photomask blanks having a plurality of interfaces where the first inorganic film and the second inorganic film are in contact with each other, for example, a photomask in which first inorganic films are formed in contact with both surfaces of a second inorganic film, a photomask in which second inorganic films are formed in contact with both surfaces of a first inorganic film, and a photomask in which first inorganic films and second inorganic film are alternately laminated.

When a plurality of first inorganic films are present, each of the first inorganic films may be the same or different from each other in terms of film function, film thickness, layer structure, composition, or the like. When a plurality of second inorganic films are present, each of the second inorganic films may be the same or different from each other in terms of film function, film thickness, layer construction, composition, or the like.

A photomask blank of the first embodiment of the invention is characterized in that when an intensity of secondary ions is measured in the thickness direction of the transparent substrate and the first inorganic film by a time-of-flight secondary ion mass spectrometry (TOF-SIMS) with using a primary ion source of Bi and a sputtering ion source of Cs, an intensity of secondary ions containing carbon detected at the interface of the transparent substrate and the first inorganic film is higher than both intensities of the secondary ions containing carbon detected, respectively, at the side of the substrate and the side of the first inorganic film.

A photomask blank of the second embodiment of the invention is characterized in that when an intensity of secondary ions is measured in the thickness direction of the first inorganic film and the second inorganic film by a time-of-flight secondary ion mass spectrometry (TOF-SIMS) with using a primary ion source of Bi and a sputtering ion source of Cs, an intensity of secondary ions containing carbon detected at the interface of the first inorganic film and the second inorganic film is higher than both intensities of the secondary ions containing carbon detected, respectively, at the side of the first inorganic film and the side of the second inorganic film.

According to the photomask blank and the photomask having the characteristics of the first embodiment or the second embodiment, changes in optical properties such as transmittance, reflectance, and phase shift amount, and the like of the inorganic film caused by heat treatment performed in the process of manufacturing the photomask from the photomask blank are suppressed. Particularly, in the first embodiment, when the transparent substrate is a quartz substrate, changes in optical properties of the inorganic film caused by oxidation at the contacted portion with the quartz ($SiO_2$) substrate in thermal history are suppressed.

As the secondary ions containing carbon, secondary ions of C may be applied. In this case, each of the transparent substrate such as a quartz substrate, the first inorganic film, and the second inorganic film may have a carbon content that is evaluated to be substantially free of carbon in the conventional composition analysis such a case that the carbon content is below detection limit (for example, less than 1 at %) in analysis by ESCA (Electron Spectroscopy for Chemical Analysis). Such a film containing a quite small amount of carbon can be formed by a method including the steps of forming almost whole of the film by using only raw materials (target and sputter gas (reactive gas)) that are free of carbon, and forming the remainder film by adding a small amount (for example one pulse) of carbon-containing raw material at the final stage of the film formation, or a method including the steps of forming almost whole of the film by using only raw materials (target and sputter gas (reactive gas)) that are free of carbon, and contacting the transparent substrate or the inorganic film with a carbon-containing substance (carbon, a carbide or an organic substance) before or after the film formation.

In addition, each of the first inorganic film and the second inorganic film may have a carbon content that is evaluated to contain carbon in the conventional composition analysis such as the above-mentioned ESCA. In this case, the film can be formed by a method including the steps of forming the whole of the film by using raw materials (target and sputter gas (reactive gas)) that contain carbon, and forming the film by increasing a quite small amount of carbon at the final stage of the film formation, or contacting the transparent substrate or the inorganic film with a carbon-containing substance (carbon, a carbide or an organic substance) before or after the film formation.

As the method of contacting the transparent substrate or the inorganic film with a carbon-containing substance before or after the film formation, a method of contacting the transparent substrate before forming the first inorganic film in the first embodiment or the first inorganic film before forming the second inorganic film in the second embodiment, with a gas atmosphere containing a carbon-containing substance by exposing to the gas atmosphere for a predetermined time (for example, 1 second to 10 minutes) is exemplified. In the case of exposing to the gas atmosphere containing a carbon-containing substance, for example, drying treatment for the substrate before forming the film or an intermediate product in which a part of the films has been formed on the transparent substrate may be performed under the gas atmosphere containing a carbon-containing substance.

As the method of contacting the transparent substrate or the inorganic film with a carbon-containing substance before or after the film formation, a method of contacting the transparent substrate before forming the first inorganic film in the first embodiment or the first inorganic film before forming the second inorganic film in the second embodiment, with a liquid (particularly, an aqueous solution) containing a carbon-containing substance for a predetermined time (for example, 5 seconds to 10 minutes), for example, pouring the liquid on the substrate or the film, or immersing the substrate or the film into the liquid, is exemplified. In this case, pure water having a total organic carbon (TOC) of not less than 3 ppb by weight, preferably not less than 5 ppb by weight, and not more than 100 ppb by weight, preferably not more than 50 ppb by weight, more preferably not more than 40 ppb by weight may be used as an aqueous solution containing a small amount of an organic substance. As the total organic carbon (TOC), for example, a value measured by a complete oxidative decomposition type TOC (total organic carbon) meter may be applied.

In particular, a manufacturing method for the photomask blank of the first embodiment may include a treatment step of contacting the surface of the transparent substrate to form the first inorganic film with an aqueous solution containing an organic substance before forming the first inorganic film, and a manufacturing method for the photomask blank of the second embodiment may include a treatment step of contacting the surface of the first inorganic film to form the second inorganic film with an aqueous solution containing an organic substance before forming the second inorganic film. In the case of contacting with the liquid containing a carbon-containing substance, for example, cleaning treatment for the substrate before forming the film or an intermediate product in which a part of the films has been formed on the transparent substrate may be performed by using the liquid containing a carbon-containing substance.

The carbon content at the interface between the transparent substrate and the first inorganic film or at the interface between the first inorganic film and the second inorganic film can be increased or reduced by adjusting a concentration of the carbon-containing substance contained in the gas atmosphere containing a carbon-containing substance or the liquid containing a carbon-containing substance, a time for exposing to the gas containing a carbon-containing substance, or a time for contacting with the liquid containing a carbon-containing substance.

The first inorganic film and the second inorganic film contain either or both of a transition metal and silicon, however, may further contain nitrogen. When either or both of the first inorganic film and the second inorganic film contain nitrogen, as the secondary ions containing carbon, either or both of secondary ions of C and secondary ions of CN may be applied. When either or both of the first inorganic film and the second inorganic film contain nitrogen, the film preferably has a nitrogen content that is evaluated to contain nitrogen in the conventional composition analysis such as the above-mentioned ESCA. In this case, the film can be formed the whole of the film by using raw materials (target and sputter gas (reactive gas)) that contain nitrogen.

With respect to the photomask blank of the invention in which the interface between the transparent substrate and the first inorganic film in the first embodiment or the interface between the first inorganic film and the second inorganic film in the second embodiment has a higher carbon content, and in which the intensity of secondary ions containing carbon such as secondary ions of C and secondary ions of CN in TOF-SIMS is increased at the interface, it is considered, not limited thereto, that the following state i) or ii): i) a state in which a quite small amount of the carbon-containing substance or a thin film (for example, one to several molecules (specifically, one, two or three molecules) in thickness) of the carbon-containing substance is sandwiched between the transparent substrate and the first inorganic film in the first embodiment or the first inorganic film and the second inorganic film in the second embodiment; or ii) a state in which the carbon-containing substance has been reacted due to temporal change or heat history at either or both of interface portions of the transparent substrate and the first inorganic film in the first embodiment or at either or both of interface portions of the first inorganic film and the second inorganic film in the second embodiment, may be formed.

Further, in the photomask blank in which the interface between the transparent substrate and the first inorganic film in the first embodiment or the interface between the first inorganic film and the second inorganic film in the second embodiment has a higher carbon content, and in which the intensity of secondary ions containing carbon such as secondary ions of C and secondary ions of CN in TOF-SIMS is increased at the interface, it is considered, not limited thereto, that the change in optical properties due to heat treatment is suppressed, since a substance such as water that are adsorbed on the surface of the film are less likely to react with the film in normal use atmosphere of a photomask blank and a photomask.

The intensity of secondary ions containing carbon is normally highest at the interface of between the transparent substrate and the first inorganic film in the first embodiment or at the interface between the first inorganic film and the second inorganic film in the second embodiment. Normally, the peak of the intensity of secondary ions containing carbon may be distributed from one side remote from the interface, through the interface, to the other side remote from the interface. Preferably, the peak is distributed in the range between not less than 0.5 nm, preferably not less than 1 nm, and not more than nm, preferably not more than 5 nm in thickness direction of the transparent substrate and the first inorganic film or the first inorganic film and the second inorganic film.

In the first embodiment and the second embodiment of the invention, when a primary ion source (excitation source) is $Bi^{3++}$ (primary acceleration voltage: 25 kV, primary current: 0.2 pA), and irradiation region is the inside of a square having a side length of 200 μm in TOF-SIMS, the intensity of secondary ions containing carbon detected at the interface between the transparent substrate and the first inorganic film or at the interface between the first inorganic film and the second inorganic film is preferably not less than 30 counts/sec and not more than 5,000 counts/sec in the case of secondary ions of C, and not less than 1,000 counts/sec and not more than 10,000 counts/sec in the case of secondary ions of CN.

The present invention can provide a photomask blank and a photomask having optical properties in such as transmittance, reflectance, phase shift amount, and the like that do not easily change, even when heat treatment is applied in the process of manufacturing a photomask from a photomask blank, by designing, selecting or manufacturing the photomask blank that satisfies the above-mentioned features of the intensity of secondary ions containing carbon that are detected at the interface between the transparent substrate and the first inorganic film in the first embodiment or at the interface between the first inorganic film and the second inorganic film in the second embodiment by TOF-SIMS under the above prescribed condition.

The first inorganic film and the second inorganic film are preferably one film that is a film (A) containing chromium and being free of silicon, and the other film that is a film (B) containing silicon and being free of chromium. For example, in case that from the substrate side, the first inorganic film and the second inorganic film are arranged, the third inorganic film is preferably the film (B) when the first inorganic film is the film (A), or the third inorganic film is preferably the film (A) when the first inorganic film is the film (B). Further, the fourth inorganic film is preferably the film (B) when the second inorganic film is the film (A), or the fourth inorganic film is preferably the film (A) when the second inorganic film is the film (B).

The film (A) contains chromium and is free of silicon. The film (A) is preferably composed of a material that is resistant to fluorine-based dry etching and can be removed by chlorine-based dry etching. Examples of the films (A) include a light-shielding film, an antireflection film, an etching stopper film for the film (B), a hard mask film used as an etching mask film for the transparent substrate or the film (B).

The film (A) may be a single-layered film, a multiple-layered film (including two or more layers) or a film having graded composition. In the cases of the multiple-layer, the film (A) may be, for example, a light-shielding film having a two-layered structure consisting of, from the substrate side, a light-shielding layer and an antireflection layer, or a three-layered structure consisting of, from the substrate side, an antireflection layer, a light-shielding layer and an antireflection layer. Further, the film (A) may be a combination of a layer having compressive stress and a layer having tensile stress for stress relaxation.

The film (A) preferably has a thickness of not less than 1 nm and not more than 100 nm. When the film (A) is a light-shielding film, the film (A) preferably set the thickness so that the whole of the films remaining as a light-shielding pattern in the resulting photomask has an optical density (OD) of preferably not less than 2.5, more preferably not less than 3 with respect to exposed light, for example, light having a wavelength of not more than 250 nm, particularly ArF excimer laser (wavelength of 193 nm) or $F_2$ laser (wavelength of 157 nm). In particular, the thickness is preferably not less than 40 nm and not more than 100 nm. When the film (A) is an etching stopper film or a hard mask film, the thickness is preferably not less than 1 nm, more preferably not less than 2 nm, and preferably not more than 30 nm, more preferably not more than 20 nm, even more preferably not more than 10 nm.

Examples of materials of the film (A) include chromium simple substance (Cr), and a chromium compound containing chromium (Cr) and at least one element selected from the group consisting of oxygen (O) and nitrogen (N), particularly, chromium oxide (CrO), chromium nitride (CrN) and chromium oxynitride (CrON). In this case, the material may have a carbon content that is evaluated to be substantially free of carbon in the conventional composition analysis such a case that the carbon content is below detection limit (for example, less than 1 at %) in analysis by ESCA. The above-mentioned chromium compound being substantially free of carbon is preferable, however, the chromium compound may contain carbon (C). Examples of chromium compounds containing carbon include chromium carbide (CrC), chromium oxycarbide (CrOC), chromium nitride carbide (CrNC) and chromium oxynitride carbide (CrONC). In this case, the chromium compound has a carbon content that is evaluated to contain carbon in the conventional composition analysis such a case that the carbon content is not less than detection limit (for example, not less than 1 at %) in analysis by ESCA. In addition, the material of the film (A) may contain hydrogen, argon, or the like.

When the material of the film (A) is a chromium compound, a chromium content of the film (A) is preferably not less than 30 at %, more preferably not less than 35 at %, and preferably less than 100 at %, more preferably not more than 90 at %; an oxygen content of the film (A) is preferably 0 at % or more, more preferably not less than 5 at %, and preferably not more than 70 at %, more preferably not more than 60 at %; a nitrogen content of the film (A) is preferably 0 at % or more, more preferably not less than 5 at %, and preferably not more than 60 at %, more preferably not more than 50 at %; and a carbon content of the film (A) is preferably 0 at % or more, more preferably not less than 1 at %, and preferably not more than 40 at %, more preferably not more than 30 at %. These contents of the chromium compound are applied except for the interface portion between the substrate and the first inorganic film or the first inorganic film and the second inorganic film (for example, the range in which secondary ions containing carbon are detected).

The film (B) contains silicon and is free of chromium. The film (B) is preferably composed of a material that is resistant to chlorine-based dry etching and can be removed by fluorine-based dry etching. The film (B) may contain a transition metal excluding chromium along with silicon. Examples of the films (B) include a light-shielding film, an antireflection film, a phase shift film such as a halftone phase shift film, an etching stopper film for the film (A), a hard mask film used as an etching mask film for the transparent substrate or the film (A).

The film (B) may be a single-layered film, a multiple-layered film (including two or more layers) or a film having graded composition. In the cases of the multiple-layer, the film (B) may be, for example, a light-shielding film having a two-layered structure consisting of, from the substrate side, a light-shielding layer and an antireflection layer, or a three-layered structure consisting of, from the substrate side, an antireflection layer, a light-shielding layer and an antireflection layer. Further, the film (B) may be a combination of a layer having compressive stress and a layer having tensile stress for stress relaxation.

The film (B) preferably has a thickness of not less than 1 nm and not more than 100 nm. When the film (B) is a light-shielding film or a phase shift film, the film (B) preferably set the thickness so that the whole of the films remaining as a light-shielding pattern in the resulting photomask has an optical density (OD) of preferably not less than 2.5, more preferably not less than 3 with respect to exposed light, for example, light having a wavelength of not more than 250 nm, particularly ArF excimer laser (wavelength of 193 nm) or $F_2$ laser (wavelength of 157 nm). In particular, the thickness is preferably not less than 40 nm and not more than 100 nm. When the film (B) is an etching stopper film or a hard mask film, the thickness is preferably not less than 1 nm, more preferably not less than 2 nm, and preferably not more than 30 nm, more preferably not more than 20 nm, even more preferably not more than 10 nm.

The film (B) is preferably a film containing silicon and being free of transition metals, or a film containing silicon and a transition metal (Me) excluding chromium, and being free of chromium. Examples of materials of the film containing silicon and being free of transition metals include silicon simple substance (Si), and a silicon compound containing silicon (Si) and at least one element selected from the group consisting of oxygen (O) and nitrogen (N), particularly, silicon oxide (SiO), silicon nitride (SiN) and silicon oxynitride (SiON). In this case, the material may have a carbon content that is evaluated to be substantially free of carbon in the conventional composition analysis such a case that the carbon content is below detection limit (for example, less than 1 at %) in analysis by ESCA. The above-mentioned silicon compound being substantially free of carbon is preferable, however, the silicon compound may contain carbon (C). Examples of silicon compounds containing carbon include silicon carbide (SiC), silicon oxycarbide (SiOC), silicon nitride carbide (SiNC) and silicon oxynitride carbide (SiONC). In this case, the silicon compound has a carbon content that is evaluated to contain carbon in the conventional composition analysis such a case that the carbon content is not less than detection limit (for example, not less than 1 at %) in analysis by ESCA.

On the other hand, examples of materials of the film containing silicon and a transition metal (Me) excluding chromium, and being free of chromium include a transition metal silicide (MeSi), and a transition metal (Me) silicon compound containing a transition metal (Me), silicon (Si) and at least one element selected from the group consisting of oxygen (O) and nitrogen (N), particularly, transition metal silicon oxide (MeSiO), transition metal silicon nitride (MeSiN) and transition metal silicon oxynitride (MeSiON). In this case, the material may have a carbon content that is evaluated to be substantially free of carbon in the conventional composition analysis such a case that the carbon content is below detection limit (for example, less than 1 at %) in analysis by ESCA. The above-mentioned transition metal (Me) silicon compound being substantially free of carbon is preferable, however, the transition metal (Me) silicon compound may contain carbon (C). Examples of transition metal (Me) silicon compounds containing carbon include transition metal silicon carbide (MeSiC), transition metal silicon oxycarbide (MeSiOC), transition metal silicon nitride carbide (MeSiNC) and transition metal silicon oxynitride carbide (MeSiONC). In this case, the compound has a carbon content that is evaluated to contain carbon in the conventional composition analysis such a case that the carbon content is not less than detection limit (for example, not less than 1 at %) in analysis by ESCA. As the transition metal (Me) excluding chromium, at least one transition metal selected from the group consisting of molybdenum (Mo), tungsten (W), tantalum (Ta), titanium (Ti), zirconium (Zr) and hafnium (Hf) are preferable, however, molybdenum (Mo) is more preferable in the point of view of dry etching processability. In addition, the material of the film (A) may contain hydrogen, or the like.

Among the materials of the film (B), silicon oxide (SiO) and silicon oxynitride (SiON) are most preferable in the point of view of etching resistance.

When the material of the film (B) is a silicon compound, a silicon content of the film (B) is preferably not less than 10 at %, more preferably not less than 30 at %, and preferably less than 100 at %, more preferably not more than 95 at %; an oxygen content of the film (B) is preferably 0 at % or more, more preferably not less than 1 at %, and preferably not more than 60 at %, more preferably not more than 30 at %; a nitrogen content of the film (B) is preferably 0 at % or more, more preferably not less than 1 at %, and preferably not more than 50 at %, more preferably not more than 40 at %; and a carbon content of the film (A) is preferably 0 at % or more, more preferably not less than 1 at %, and preferably not more than 50 at %, more preferably not more than 40 at %. These contents of the silicon compound are applied except for the interface portion between the substrate and the first inorganic film or the first inorganic film and the second inorganic film (for example, the range in which secondary ions containing carbon are detected).

On the other hand, when the material of film (B) is a transition metal silicide (MeSi), a transition metal (Me) content of the film (B) is preferably more than 0 at %, more preferably not less than 0.5 at %, and preferably less than 100 at %, more preferably not more than 10 at %; and a silicon content of the film (B) is preferably more than 0 at %, more preferably not less than 30 at %, and preferably less than 100 at %, more preferably not more than 90 at %. When the material of film (B) is a transition metal (Me) silicon compound, a transition metal (Me) content of the film (B) is preferably more than 0 at %, more preferably not less than 0.5 at %, and preferably less than 100 at %, more preferably not more than 5 at %; a silicon content of the film (B) is preferably more than 0 at %, more preferably not less than 30 at %, and preferably less than 100 at %, more preferably not more than 80 at %; an oxygen content of the film (B) is preferably 0 at % or more, and preferably not more than 60 at %, more preferably not more than 30 at %: a nitrogen content of the film (B) is preferably 0 at % or more, more preferably not less than 1 at %, and preferably not more than 50 at %, more preferably not more than 40 at %; and a carbon content of the film (B) is preferably 0 at % or more, and preferably not more than 10 at %, more preferably not more than 5 at %. These contents of the transition metal (Me) silicide and the transition metal (Me) silicon compound are applied except for the interface portion between the substrate and the first inorganic film or the first inorganic film and the second inorganic film (for example, the range in which secondary ions containing carbon are detected).

The photomask blank of the invention may be a binary mask blank or a phase shift mask blank such as a halftone phase shift mask blank. From these, a binary mask, and a phase shift mask such as a halftone phase shift mask are manufactured, respectively. Examples of film structures on the transparent substrate include, for example, a structure in which only a light-shielding film of the film (A) or the film (B) is formed on a transparent substrate, a structure in which an etching stopper film of the film (A), a light-shielding film of the film (B), and a hard mask film of the film (A) are formed in this order from the side of a transparent substrate, a structure in which a light-shielding film of the film (A), and a light-shielding film of the film (B) are formed in this order from the side of a transparent substrate, and a structure in which a light-shielding film of the film (A), a light-shielding film of the film (B), and a hard mask film of the film (A) are formed in order from the side of a transparent substrate.

In the photomask blank of the invention, an organic film such as a resist film may be formed on the side of the inorganic film remotest from the transparent substrate. The resist film may be an electron beam resist which can be drawn with an electron beam or a photoresist which can be drawn with light, and a chemically amplified resist is preferable. The chemically amplified resist may be a positive type resist or a negative type resist. The chemically amplified resist contains, for example, a hydroxystyrene resin or a (meth)acrylic acid resin, and an acid generator, and is optionally added a cross-linking agent, a quencher, a surfactant or the like.

The formation of the inorganic film used for the photomask blank of the invention can be performed by, for example, a sputtering method, however, not limited thereto. As the sputtering method, DC sputtering, RF sputtering or the like can be applied, however, not limited thereto.

A chromium target may be used for forming the film (A), as a sputter target. On the other hand, a silicon target may be used for forming the film (B) of the film containing silicon and being free of transition metals, as a sputter target. Further, a target of transition metal (Me) excluding chromium, and a silicon target may be used for forming the film (B) of the film containing silicon and a transition metal (Me) excluding chromium, and being free of chromium, as a sputter target. In this case, co-sputtering may also be performed by using a silicon target and a target of a transition metal (Me) excluding chromium; a plurality of targets containing silicon and a transition metal (Me) excluding chromium, and having different compositions each other (targets in which some or all of the constituent elements are different, or targets in which the constituent elements are the same but concentrations are different); or a silicon target or a target of a transition metal (Me) excluding chromium, and a target containing silicon and a transition metal (Me) excluding chromium. A power applied across the target is adjusted in consideration of target size, cooling efficiency, controllability of formation of the inorganic film, or the like. Typically, the power is 0.1 to 10 W/cm$^2$ with respect to the unit sputtering area of the sputtering target.

When forming a film of a material composed of only one or both of silicon and a transition metal, as a sputter gas, only a rare gas such as helium gas (He), neon gas (Ne), argon gas (Ar) and krypton gas (Kr) is used. On the other hand, when forming a film of a material containing oxygen, nitrogen or carbon, the sputtering is preferably reactive sputtering. As a sputter gas, a rare gas such as helium gas (He), neon gas (Ne), argon gas (Ar), krypton gas (Kr), and a reactive gas are used. When forming a film of a material containing oxygen or nitrogen, a gas containing oxygen or nitrogen may be used as the reactive gas. Examples of gases containing oxygen include oxygen gas ($O_2$ gas) and carbon dioxide gas ($CO_2$ gas), and nitrogen oxide gases such as nitrogen dioxide gas ($NO_2$ gas) and nitrogen monoxide gas (NO gas). Examples of gases containing nitrogen include nitrogen gas ($N_2$ gas) and nitrogen oxide gases such as nitrogen dioxide gas ($NO_2$ gas) and nitrogen monoxide gas (NO gas). When forming a film of a material containing carbon, a gas containing carbon such as methane gas ($CH_4$) and carbon dioxide gas ($CO_2$ gas) may be used as the reactive gas.

A pressure for film formation may be appropriately set in consideration of stress, chemical resistance, cleaning resistance, or the like, of the inorganic film. Chemical resistance can be improved by adjusting the pressure of normally not less than 0.01 Pa, particularly not less than 0.03 Pa, and normally not more than 1 Pa, particularly not more than 0.3 Pa. Further, each gas flow rate may be appropriately set so as to obtain a desired composition, and is normally 0.1 to 100 sccm.

In the process of manufacturing the photomask blank, heat treatment may be performed to the transparent substrate or the transparent substrate and the inorganic film. As a method of the heat treatment, infrared heating, resistance heating, or the like can be applied, and treatment conditions are not particularly limited. The heat treatment may be carried out, for example, under atmosphere of gas containing oxygen. The concentration of the gas containing oxygen is, for example, 1 to 100% by volume in case of oxygen gas ($O_2$ gas), however, not limited thereto. A temperature of the heat treatment is preferably not less than 200° C., more preferably not less than 400° C. Further, in the manufacturing process of the photomask blank, the inorganic film may be subjected to ozone treatment, plasma treatment, or the like, and conditions for the treatment are not particularly limited. Each treatment may be performed for the purpose of increasing oxygen concentration on the surface portion of the inorganic film, and in each case, conditions of the treatment may be appropriately adjusted so as to obtain a predetermined oxygen concentration.

In the process of manufacturing the photomask blank, cleaning treatment may be performed in order to remove particles existing on the surface of the transparent substrate or the inorganic film. The cleaning can be carried out by using one or both of ultrapure water, and a functional water which is ultrapure water containing ozone gas, hydrogen gas or the like. Further, after washing with ultrapure water containing a surfactant, the cleaning may be carried out by using one or both of ultrapure water, and a functional water. The cleaning can be carried out while irradiating ultrasonic, if needed, and further, can be combined with UV light irradiation.

A photomask can be manufactured from the photomask blank of the invention. As a method for manufacturing a photomask from a photomask blank, a commonly known method can be applied. For example, first, the above-mentioned photomask blank of the invention is prepared, and a photomask pattern of the inorganic film included in the photomask blank is formed. Generally, a photomask can be manufactured by using a resist film: forming a resist pattern from the resist film: selecting chlorine-based dry etching or fluorine-based dry etching in accordance with the etching characteristics of the film to be etched (inorganic film) or the transparent substrate: and patterning the inorganic film on the transparent substrate, or the inorganic film and the transparent substrate in this order by using the resist patten or the mask pattern formed in the photomask manufacturing process from the inorganic film included in the photomask blank, as an etching mask. A method for applying the resist film is not particularly limited, and a commonly known method may be applied. A thickness of the resist film can be appropriately set so as to obtain a photomask pattern having a good shape. The thickness is preferably not less than 50 nm, more preferably not less than 70 nm, and preferably not more than 200 nm, more preferably not more than 150 nm.

In a photolithographic method for forming a pattern with a half pitch of not more than 50 nm, preferably not more than 30 nm, and more preferably not more than 20 nm, even more preferably not more than 10 nm on a substrate to be processed, the photomask of the invention is best suited for use in exposure including the steps of forming a photoresist film on the substrate to be processed, and exposing the photoresist film by light of wavelength not more than 250 nm, especially not more than 200 nm, typically ArF excimer laser (wavelength of 193 nm) or $F_2$ laser (wavelength of 157 nm), through the photomask for transferring the pattern to the photoresist film.

The photomask obtained from the photomask blank may be applied to the pattern forming process including irradiating exposure light to the photomask pattern for transferring the photomask pattern to an object to be exposed (a photoresist film) on the substrate to be processed. The irradiation of exposure light may be either dry exposure or immersion exposure. The photomask of the invention is effective particularly when a photomask pattern is exposed by the immersion lithography for a wafer of not less than 300 mm as the substrate to be processed.

EXAMPLE

Examples are given below for further illustrating the invention although the invention is not limited thereto.

Example 1

Ultraviolet light having a wavelength of 172 nm was irradiated to the surface of a quartz substrate having dimensions of 152 mm-square and about 6 mm-thick by a UV lamp. Then, the surface was rinsed (washed) with pure water having a total organic carbon (TOC) of 4 to 10 ppb by weight, and was dried. Next, a light-shielding film consisting of two layers that is, from the quartz substrate side, a CrN layer (thickness of 30 nm) and a CrON layer (thickness of 20 nm) was formed as a first inorganic film by sputtering method. The sputtering was performed by using nitrogen gas and argon gas for the CrN layer, and oxygen gas, nitrogen gas and argon gas for the CrON layer, as sputter gases, and using a chromium metal as a target, while rotating the quartz substrate at 30 rpm. The composition of the light-shielding film was measured by ESCA. The CrN layer had a composition of Cr:N=9:1 in atomic ratio, and the CrON layer had a composition of Cr:O:N=4:5:1 in atomic ratio. Carbon was not detected in each layer by ESCA.

Intensities of emitted secondary ions of the obtained two photomask blanks (Sample 1 and Sample 2), which were obtained the same method, were measured in the thickness direction of the quartz substrate the first inorganic film by a time-of-flight secondary ion mass spectrometry (TOF- SIMS) apparatus (ION-TOF GmbH). A sputter ion gun for surface etching and an ion gun for excited ion were used for the measurement. Sputter ions were Cs ions, and primary ions (excited ions) were $Bi_3^{++}$ ions (primary accelerated voltage: 25 kV, primary current: 0.2 pA). Distributions of secondary ion intensity (normalized secondary ion intensity) for several kinds of secondary ions were measured at the interface and its vicinities of the quartz substrate and the first inorganic film within an irradiation area that is inside of a square having a side length of 200 μm with detecting the several kinds of secondary ions emitted at the interface and its vicinities of the quartz substrate and the first inorganic film by a detector, while repeating, alternately, etching by sputter ions, and measurement of the secondary ions emitted by irradiation of primary ions.

In sample 1, a peak having an apex that corresponds to the interface between the quartz substrate and the first inorganic film was observed, and at the interface, the intensity of the C secondary ions was 70, and the intensity of the CN secondary ions was 3,000. On the other hand, at the position of the quartz substrate adequately remote from the interface, the intensity of the C secondary ions was 5, and the intensity of the CN secondary ions was 20. At the position of the first inorganic film adequately remote from the interface, the intensity of the C secondary ions was 20, and the intensity of the CN secondary ions was 700. Further, the obtained photomask blank was heat-treated at 300° C. for 2 hours, and the transmittances before and after the heat treatment were measured with 488 nm light, which is a general inspection wavelength of the photomask blank. The transmittance changed from 11.2% to 12.1% before and after the heat treatment.

In sample 2, a peak having an apex that corresponds to the interface between the quartz substrate and the first inorganic film was observed, and at the interface, the intensity of the C secondary ions was 100, and the intensity of the CN secondary ions was 7,000. On the other hand, at the position of the quartz substrate adequately remote from the interface, the intensity of the C secondary ions was 5, and the intensity of the CN secondary ions was 20. At the position of the first inorganic film adequately remote from the interface, the intensity of the C secondary ions was 20, and the intensity of the CN secondary ions was 700. Further, the obtained photomask blank was heat-treated at 300° C. for 2 hours, and the transmittances before and after the heat treatment were measured with 488 nm light, which is a general inspection wavelength of the photomask blank. The transmittance changed from 11.2% to 12.3% before and after the heat treatment.

Comparative Example 1

Ultraviolet light having a wavelength of 172 nm was irradiated to the surface of a quartz substrate having dimensions of 152 mm-square and about 6 mm-thick by a UV lamp. Then, the surface was rinsed (washed) with pure water having a total organic carbon (TOC) of not more than 1 ppb by weight, and was dried. Next, a light-shielding film consisting of two layers that is, from the quartz substrate side, a CrN layer (thickness of nm) and a CrON layer (thickness of 20 nm) was formed as a first inorganic film by sputtering method. The sputtering was performed by using nitrogen gas and argon gas for the CrN layer, and oxygen gas, nitrogen gas and argon gas for the CrON layer, as sputter gases, and using a chromium metal as a target, while rotating the quartz substrate at 30 rpm. The composition of the light-shielding film was measured by ESCA. The CrN layer had a composition of Cr:N=9:1 in atomic ratio, and the CrON layer had a composition of Cr:O:N=4:5:1 in atomic ratio. Carbon was not detected in each layer by ESCA.

Intensities of emitted secondary ions of the obtained one photomask blank was measured in the thickness direction of the quartz substrate the first inorganic film by a time-of-flight secondary ion mass spectrometry (TOF-SIMS) apparatus (ION-TOF GmbH). A sputter ion gun for surface etching and an ion gun for excited ion were used for the measurement. Sputter ions were Cs ions, and primary ions (excited ions) were $Bi_3^{++}$ ions (primary accelerated voltage: 25 kV, primary current: 0.2 pA). Distributions of secondary ion intensity (normalized secondary ion intensity) for several kinds of secondary ions were measured at the interface and its vicinities of the quartz substrate and the first inorganic film within an irradiation area that is inside of a square having a side length of 200 μm with detecting the several kinds of secondary ions emitted at the interface and its vicinities of the quartz substrate and the first inorganic film by a detector, while repeating, alternately, etching by sputter ions, and measurement of the secondary ions emitted by irradiation of primary ions.

A peak having an apex that corresponds to the interface between the quartz substrate and the first inorganic film was not observed, and at the interface, the intensity of the C secondary ions was 20, and the intensity of the CN secondary ions was 400. On the other hand, at the position of the quartz substrate adequately remote from the interface, the intensity of the C secondary ions was 4, and the intensity of the CN secondary ions was 10. At the position of the first inorganic film adequately remote from the interface, the intensity of the C secondary ions was 20, and the intensity of the CN secondary ions was 700. Further, the obtained photomask blank was heat-treated at 300° C. for 2 hours, and the transmittances before and after the heat treatment were measured with 488 nm light, which is a general inspection wavelength of the photomask blank. The transmittance changed from 11.2% to 13.5% before and after the heat treatment.

Japanese Patent Application No. 2020-112663 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a photomask blank comprising a transparent substrate, a first inorganic film which is in contact with the transparent substrate, and comprises nitrogen, and either or both of a transition metal and silicon, and a second inorganic film which comprises nitrogen, and either or both of a transition metal and silicon, has a composition different from a composition of the first inorganic film, and is in contact with the first inorganic film, wherein when an intensity of secondary ions is measured in the thickness direction of the first inorganic film and second inorganic film by a time-of-flight secondary ion mass spectrometry (TOF-SIMS) with using a primary ion source of Bi and a sputtering ion source of Cs, an intensity of secondary ions of CN detected at the interface of the first inorganic film and the second inorganic film is higher than both intensities of the secondary ions of CN detected, respectively, at the side of the first inorganic film and the side of the second inorganic film, wherein the method comprises the step of treating the film forming surface of the first inorganic film for the second inorganic film by contacting the surface with an aqueous solution comprising an organic substance, before the second inorganic film is formed, wherein the aqueous solution containing an organic substance is pure water having a total organic carbon (TOC) of not less than 3 ppb and not more than 100 ppb.

2. The method of claim 1 wherein each of the first inorganic film and the second inorganic film is formed by using only raw materials being substantively free of carbon.

3. The method of claim 1 wherein one of the first inorganic film and the second inorganic film comprises chromium and is free of silicon, and the other comprises silicon and is free of chromium.

4. The method of claim 1 wherein the first inorganic film is an etching stopper film.

5. The method of claim 1 wherein the photomask blank is a material of a photomask which utilizes exposure light having a wavelength of not more than 250 nm.

6. The method of claim 1 wherein the first inorganic film has a thickness of 1 to 30 nm.

* * * * *